United States Patent
Nakamura et al.

(10) Patent No.: US 6,922,339 B2
(45) Date of Patent: Jul. 26, 2005

(54) HEAT DISSIPATING STRUCTURE OF PRINTED CIRCUIT BOARD AND FABRICATING METHOD THEREOF

(75) Inventors: Daisuke Nakamura, Kamifukuoka (JP); Takeshi Aota, Kamifukuoka (JP)

(73) Assignee: New Japan Radio Co., Ltd., Tokyo-to (JP)

( * ) Notice: Subject to any disclaimer, the term of this patent is extended or adjusted under 35 U.S.C. 154(b) by 0 days.

(21) Appl. No.: 10/722,163

(22) Filed: Nov. 25, 2003

(65) Prior Publication Data

US 2004/0156175 A1 Aug. 12, 2004

(30) Foreign Application Priority Data

Nov. 26, 2002 (JP) ........................................ 2002-342456

(51) Int. Cl.⁷ ................................................. H05K 7/20
(52) U.S. Cl. ...................... 361/719; 361/707; 257/706; 257/707; 165/80.3; 165/185
(58) Field of Search ................................ 361/704–707, 361/709, 717–719, 760, 767; 257/706, 707, 713, 720; 165/80.3, 185

(56) References Cited

U.S. PATENT DOCUMENTS

| | | | | |
|---|---|---|---|---|
| 5,617,294 A | * | 4/1997 | Watson et al. ............... | 361/719 |
| 5,708,566 A | * | 1/1998 | Hunninghaus et al. ...... | 361/704 |
| 5,751,063 A | * | 5/1998 | Baba ........................... | 257/723 |
| 5,920,458 A | * | 7/1999 | Azar ........................... | 361/704 |
| 6,067,231 A | * | 5/2000 | Lu ............................... | 361/704 |
| 6,411,516 B1 | * | 6/2002 | Palumbo et al. ............. | 361/704 |
| 6,580,611 B1 | * | 6/2003 | Vandentop et al. .......... | 361/704 |
| 6,625,028 B1 | * | 9/2003 | Dove et al. .................. | 361/707 |
| 6,816,377 B2 | * | 11/2004 | Itabashi et al. .............. | 361/704 |

FOREIGN PATENT DOCUMENTS

JP   5-259669   10/1993

OTHER PUBLICATIONS

Patent Abstracts of Japan, Publication No. 05–259669, Date of Publication: Oct. 8, 1993.

* cited by examiner

Primary Examiner—Boris Chervinsky

(57) ABSTRACT

A heat dissipating structure of a printed circuit board on which a circuit pattern is provided so that a heat generating part can be mounted, and which has a through hole formed at a site where the heat generating part is mounted from a surface on which the heat generating part is mounted to the opposite surface. A heat dissipating member made of a material with a thermal conductivity higher than a board of the printed circuit board, and having a shape worked so that the heat dissipating member can be inserted into the through hole is mounted in the through hole with an adhesive interposed therebetween. Heat generated from a heat generating part is transferred by way of a heat dissipating member to as far as a conductor of the GND surface or heat dissipating fins.

2 Claims, 7 Drawing Sheets

HEAT DISSIPATING STRUCTURE OF PRINTED CIRCUIT BOARD AND FABRICATING METHOD THEREOF

CROSS-REFERENCE TO RELATED APPLICATION

Priority is claimed from Japanese patent application 2002-342456 filed Nov. 26, 2002.

BACKGROUND OF THE INVENTION

The present invention relates a heat dissipating structure of a printed circuit board on which a heat generating part is mounted and a fabricating method thereof, and particularly, to a heat dissipation structure thereof improving a heat dissipativity of a heat generating part.

There are conventionally available boards each having a heat dissipating structure to cope with heat generation of electronic parts (heat generating parts) mounted as described below. FIG. 9 is a sectional view of a heat dissipating structure of a printed circuit board in which a through hole is formed and a numeral 1 denotes an electronic part, 2 a though hole and 3 a printed circuit board, which is fabricated by forming the through hole 2, on the inner wall of which a conductor is formed, in the printed circuit board 3 at a site where the electronic part 1 is mounted.

Heat generated by the electronic part 1 is transferred to as far as a conductor constituting a GND surface or heat dissipating fins (not shown) of the lower side of the printed circuit substrate 3 by way of the through hole 2 and dissipated there. A construction is also available in which the through hole 2 is filled with a resin paste with a high thermal conductivity and the resin paste is then cured, thereby transferring heat by way of the resin paste to raise heat dissipativity.

Then, in FIG. 10, there is shown a sectional view of a heat dissipating structure of a printed circuit board having a metal core board, wherein a numeral 1 denotes an electronic part, 30 a conductor layer, 31 an insulator layer and 32 a metal core. A resin or the like is applied as the insulator layer 31 on the metal core 32, on which a circuit made of the conductor layer 30 is formed, thereby fabricating the board including the metal core 32. While the insulator layer 31 is generally made of a resin with a low thermal conductivity, the layer is thin, so that a thermal resistivity can be set to a low value. Heat generated from the electronic part 1 is transmitted through the insulator layer 31 and transferred into the metal core 32 of the board, followed by heat dissipation.

As one of the other examples of heat dissipating structures, there is disclosed a structure which dissipates heat of a part to the rear surface side by way of a high thermal conductivity metal, with a construction formed in a procedure that a through hole in an insulating board at a site where a high heat generating part is mounted is filled with a copper paste and the copper paste is dried and thermally cured to form the high thermal conductivity metal in an embedded state, followed by formation of high thermal conductivity insulating layers on the front and rear surfaces of the insulating board; and further a fabricating method of the structure (see Japanese Unexamined Patent Publication No. 5-259669 (1993), hereinafter referred to as Patent document 1).

In the heat dissipating structure of FIG. 9, a high heat dissipating effect cannot be achieved in a state where the through hole is hollow. In order to obtain a higher heat dissipating effect, the through hole is filled with a high thermal conductivity resin paste or the like. If bubbles and the like are mixed into the resin during filling the resin paste, however, unfilling of the resin and/or voids occur to raise a thermal resistance. Prevention of such inconveniences causes a machine and material, which are expensive, to be inevitably used, resulting in a high cost.

Then, a structure of FIG. 10 can be fabricated more stably than that of FIG. 9 and a heat dissipating effect is also expected to be greater as compared with the structure of FIG. 9 because of a better heat transfer efficiency, whereas the structure of FIG. 10 is costwise higher as compared with an ordinary printed circuit board because of the use of a more expensive material.

In a structure such as shown Patent document 1, since the through hole is filled with copper paste as a high thermal conductivity metal, a possibility arises that bubbles occur in the paste as in the structure of FIG. 9, and in addition, there have been other problems that arise that necessitates steps for forming a high thermal conductivity insulating layer and for drying and thermal curing in the filling for planarization, which complicates both the structure and process.

SUMMARY OF THE INVENTION

It is an object of the present invention to solve the above problems and to provide a heat dissipating structure of a printed circuit board, which is simple, easy, and inexpensive, and has a high heat dissipativity; and a to provide a method for fabricating the structure.

The present invention is directed to a heat dissipating structure of a printed circuit board on which a circuit pattern is provided so that a heat generating part can be mounted, and which has a through hole formed at a site where the heat generating part is mounted from a surface on which the heat generating part is mounted to the opposite surface, wherein a heat dissipating member made of a material with a thermal conductivity higher than a board of the printed circuit board, and having a shape worked so that the heat dissipating member can be inserted into the through hole is mounted in the through hole with an adhesive interposed therebetween.

A heat transfer plate made of a material with a thermal conductivity higher than the printed circuit board is preferably adhered on the heat dissipating member of the printed circuit board and heat generated by a heat generating part mounted on the heat transfer plate is dissipated to the heat dissipating member by way of the heat transfer plate.

The present invention is also directed to a method of fabricating a heat dissipating structure of a printed circuit board on which a circuit pattern is provided so that a heat generating part can be mounted, and which has a through hole formed at a site where the heat generating part is mounted from a surface on which the heat generating part is mounted to the opposite surface, a heat dissipating member being mounted in the through hole. The method includes the steps of: blocking one opening of the through hole formed in the printed circuit board with a heat resistant tape; inserting the heat dissipating member, made of a material with a thermal conductivity higher than a board of the printed circuit board, and having a shape worked so that the heat dissipating member can be inserted into the through hole, into the through hole from the other opening of the through hole; fixing the heat dissipating member by putting an adhesive into a clearance between the through hole and the heat dissipating member to cure the adhesive; and removing the heat resistant tape from the printed circuit board.

The present invention is further directed to a method of fabricating a heat dissipating structure of a printed circuit board on which a circuit pattern is provided so that a heat generating part can be mounted, and which has a through hole formed at a site where the heat generating part is mounted from a surface on which the heat generating part is mounted to the opposite surface, a heat dissipating member being mounted in the through hole. The method includes the steps of: working shapes of the through hole and the heat dissipating member so that the heat dissipating member made of a material with a thermal conductivity higher than a board of the printed circuit board is supported in the through hole to insert the heat dissipating member into the through hole for provisional fixation; and fixing the heat dissipating member by putting an adhesive into a clearance between the through hole and the heat dissipating member to cure the adhesive.

The step of putting the adhesive into a clearance between the through hole and the heat dissipating member to cure the adhesive and to fix the heat dissipating member is performed in a procedure in which the adhesive is not only put into a clearance between the through hole and the heat dissipating member, but also attached onto the heat dissipating member, a heat generating part is mounted onto the heat dissipating member, and thereafter the adhesive is cured, whereby the through hole and the heat dissipating member, and the heat dissipating member and the heat generating part are collectively fixed simultaneously.

With such a structure, heat generated from a heat generating part is transferred by way of a heat dissipating member (and a heat transfer plate) with a high thermal conductivity to as far as a conductor of the GND surface or heat dissipating fins; therefore, a high heat dissipativity can be realized. Not only is fabrication in an ordinary part mounting process enabled, but a step of using a heat resistant tape can also be eliminated by designing shapes of a through hole and a heat dissipating member.

DETAILED DESCRIPTION

Figure 1:
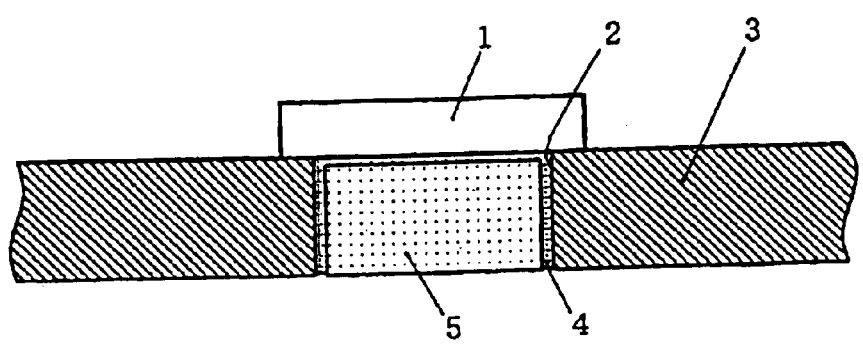
FIG. 1 is a schematic diagram of a section of a heat dissipating structure of a printed circuit board according to the present invention.

FIG. 1 is an example showing a section of a heat dissipating structure of a printed circuit board according to the present invention on which an electronic part is mounted. Numeral 1 denotes an electronic part assembled by resin molding a semiconductor chip, 2 a through hole, 3 a printed circuit board having a board, made of glass epoxy or one of other insulating materials, and on a surface of which a circuit pattern (not shown) using copper foil or the like is provided, 4 a metal solder such as soft solder and silver paste (an adhesive), and 5 a metal plate (a heat dissipating member) made with copper on which, for example, there is applied a surface treatment such as a general black oxide treatment (formation of cuprous oxide on a surface) in order to facilitate adhesion with an adhesive. The electronic part 1, the through hole 2 and the metal plate 5 are adhered to one another with the metal solder 4, which is an adhesive. Heat generated from the electronic part 1 is transferred through the metal plate 5 and to as far as the rear surface of the printed circuit board 3 and dissipated into the air. Since conductance of heat is performed through the metal plate 5 made of a material with a thermal conductivity higher than the board material of the printed circuit board 3, a thermal resistance can be rendered to be extremely low; thereby enabling suppression of rise in temperature of the electronic part 1 to the lowest possible level. Note that shapes of the metal plate 5 and the through hole 2 can be altered into various shapes such as the shape of a rectangle regardless of the shapes shown in the drawing.

Figure 2:
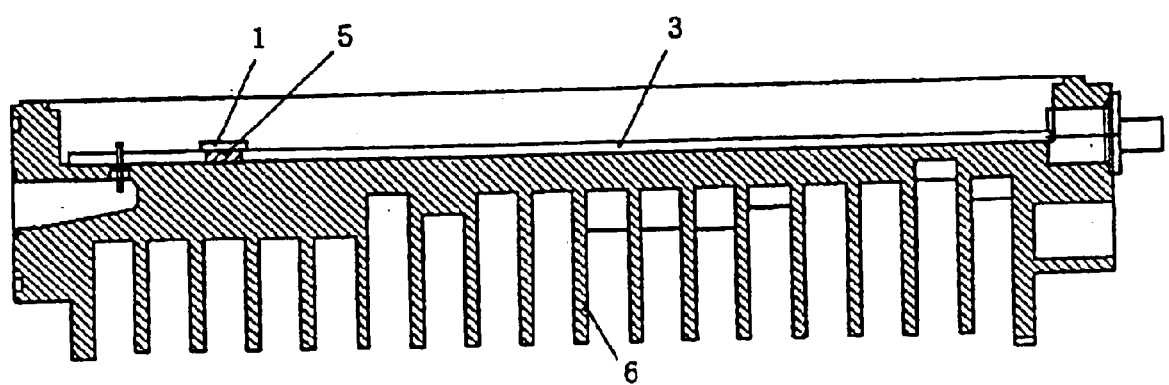
FIG. 2 is a schematic diagram of a section of a printed circuit board according to the present invention assembled into a device housing.

FIG. 2 is an explanatory view of a section of the printed circuit board 3 on which the electronic part 1 shown in FIG. 1 is mounted, and assembled into a device housing 6. Heat of the electronic part 1 is transmitted to the rear surface of the printed circuit board 3 by way of the metal plate 5 with a high thermal conductivity and thereafter, dissipated through the housing 6. In cases except the example of FIG. 2 as well, efficient heat dissipation can be realized by connecting dissipating fins in various shapes to the metal plate 5 of the printed circuit board 3.

FIGS. 3(a) to 3(e) show a process of fabricating a structure according to the present invention. At first, a printed circuit board 3 having a circuit pattern (not shown) on a surface thereof is prepared, a heat resistant tape 7 having a stickiness is adhered onto an opening on the other side of the through hole 2 from an electronic part mounting surface to thereby block the through hole 2 (FIG. 3(a)). Then, the metal plate 5 worked into a shape which can be inserted into the through hole 2 in advance is inserted into the through hole 2 (FIG. 3(b)).

Figure 3A:
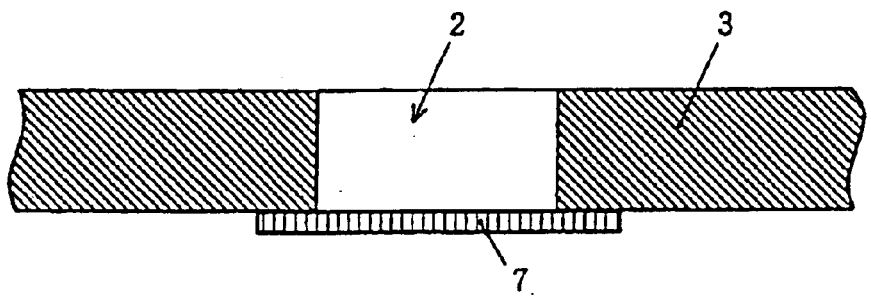
FIGS. 3(a) to 3(e) are explanatory views of a process of fabricating a heat dissipating structure of a printed circuit board according to the present invention.
Figure 3B:
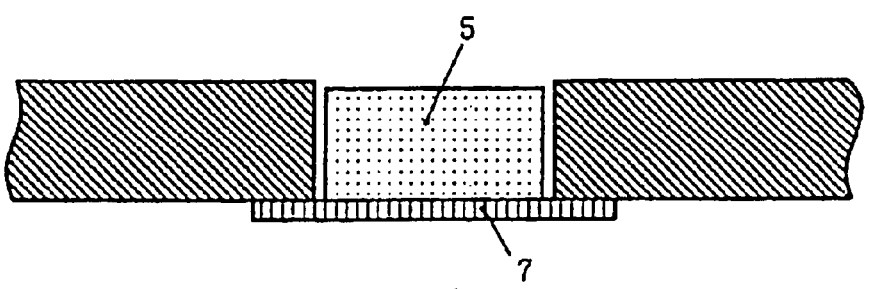
Figure 3C:
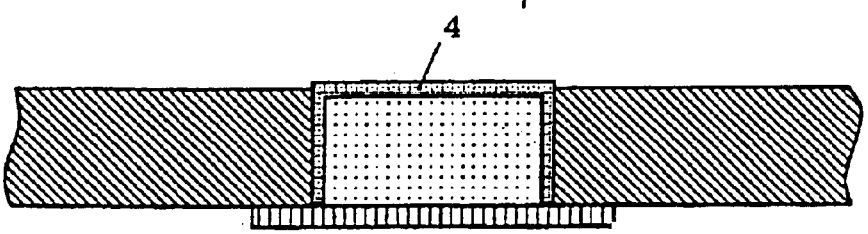
Figure 3D:
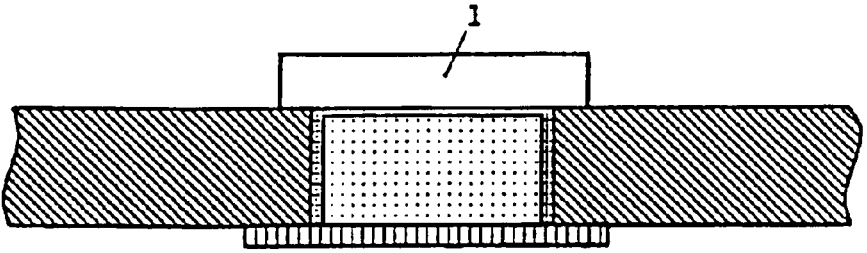

Then, a screen printing process is applied with a soft solder as the metal solder 4, or alternatively, a silver paste is applied to thereby supply the metal solder 4 into a clearance between the through hole 2 and the metal plate 5, and onto the metal plate 5 (FIG. 3(c)). Even if the metal solder 4 intruding into a clearance between the through hole 2 and the metal plate 5 included bubbles, the bubbles would have no influence on the thermal resistance since heat is dissipated through the metal plate 5, and the presence of bubbles does not affect reliability either since the bubbles are very small in amount and do not contact directly to an electronic part or the like. Note that a resin paste can replace the metal solder 4.

Then, the electronic part 1 is mounted onto the metal plate 5 (with omitting mounting of other parts than the electronic part 1). With a solder reflow apparatus, an oven or a hot plate, the metal solder 4 is made molten under a heating condition suitable for the printed circuit board, followed by hardening to connect the electronic part 1, the through hole 2 and the metal plate 5 to one another simultaneously (FIG. 3(d)).

Figure 3E:
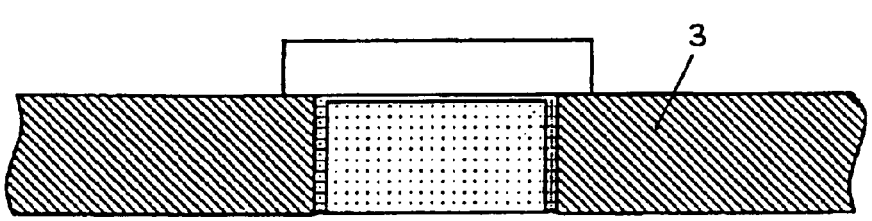

Finally, the heat resistant tape is peeled off from the printed circuit board 3 (FIG. 3(e)). In the above process, the heat resistant tape 7 is required to have a resistance to a heat history (for example, in a case of a solder, at temperatures in the vicinity of 200° C.) in the above process. To be concrete, examples of the heat resistant tape include a polyimide based heat resistant tape, a paper based heat resistant tape and the like.

Figure 4:
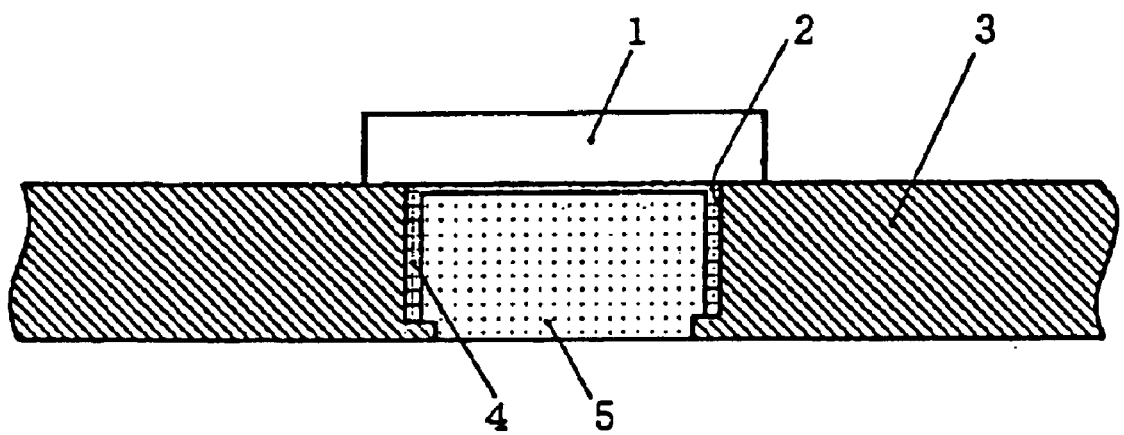
FIG. 4 is a schematic view of a section of a heat dissipating structure of a printed circuit board having a through hole according to the present invention on an inner wall surface of which a protrusion is formed.
Figure 5:
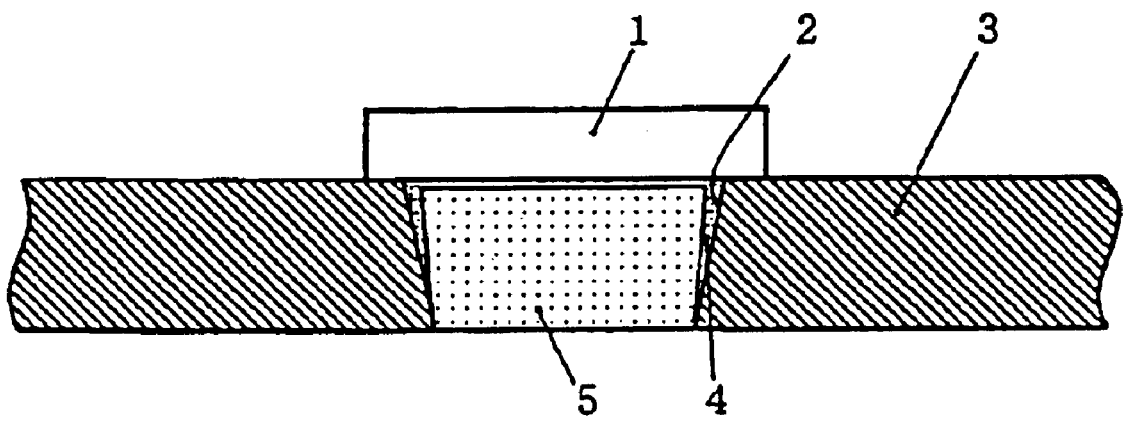
FIG. 5 is a schematic diagram of a section of a heat dissipating structure of a printed circuit board according to the present invention having a through hole and a metal plate of a tapered shape respectively.

FIGS. 4 and 5 are other examples of the present invention, wherein a protrusion is provided on the inner wall of the through hole 2 (FIG. 4), and the metal plate 5 and the through hole 2 are both tapered downwardly (FIG. 5) and in both cases, the bottom surface of the metal plate 5 is stopped at the position of the lower surface of the printed circuit board 3 so that the metal plate 5 can be supported in the through hole 2. With this structure, no heat resistant tape is used for provisionally fixing the metal plate in the through hole 2 and only if the metal solder 4 is supplied into a clearance between the through hole 2 and the metal plate 5, and onto the metal plate 5 without causing the metal solder 4 to flow out from the lower portion of the printed circuit board 3, steps of FIGS. 3(a) and 3(e) becomes unnecessary.

Figure 6A:
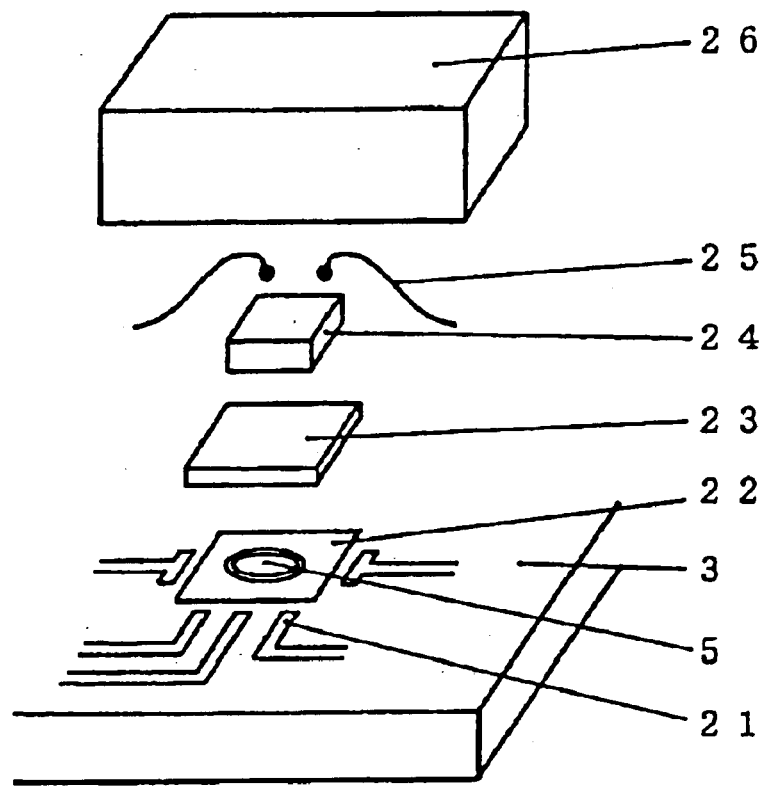
FIG. 6(a) is an explanatory view of a method of mounting a bare chip or the like to a heat dissipating structure of a printed circuit board according to the present invention and FIG. 6(b) is a schematic view of a section after mounting.
Figure 6B:
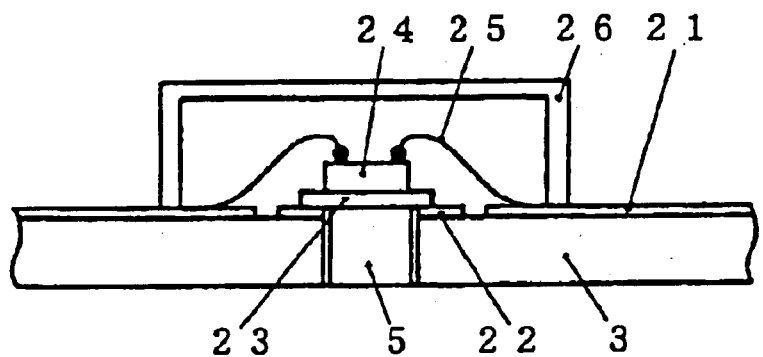

FIG. 6(a) is an explanatory view of a method of mounting a bare chip such as a semiconductor (a heat generating part) as a concrete example of mounting an electronic part to a printed circuit board. FIG. 6(b) is a section after mounting. Numeral 21 denotes a conductor circuit layer made of a copper foil, 22 a heat dissipating land layer made of a copper foil, 23 a heat dissipating chip plate (a heat transfer plate) made of a material with a high thermal conductivity similar to the metal plate 5 made of copper or the like, 24 a bare chip, 25 bonding wires and 26 a cap. A series of steps including as far as a mounting step of the heat dissipating chip plate 23 of this method for assembly is realized, in a series of part mounting steps similar to the steps described in FIG. 3, by adhering the heat dissipating chip plate 23 instead of the electronic part 1 onto the metal plate 5 with a solder.

After mounting the heat dissipating chip plate 23, the bare chip 24 is mounted onto the heat dissipating chip plate 23 with a silver paste or the like, the chip 24 and a conductor circuit 21 is connected by a bonding wire 25 to each other and the cap 26 is attached to the printed circuit board 3, thereby completing mounting of the electronic part.

Figure 7:
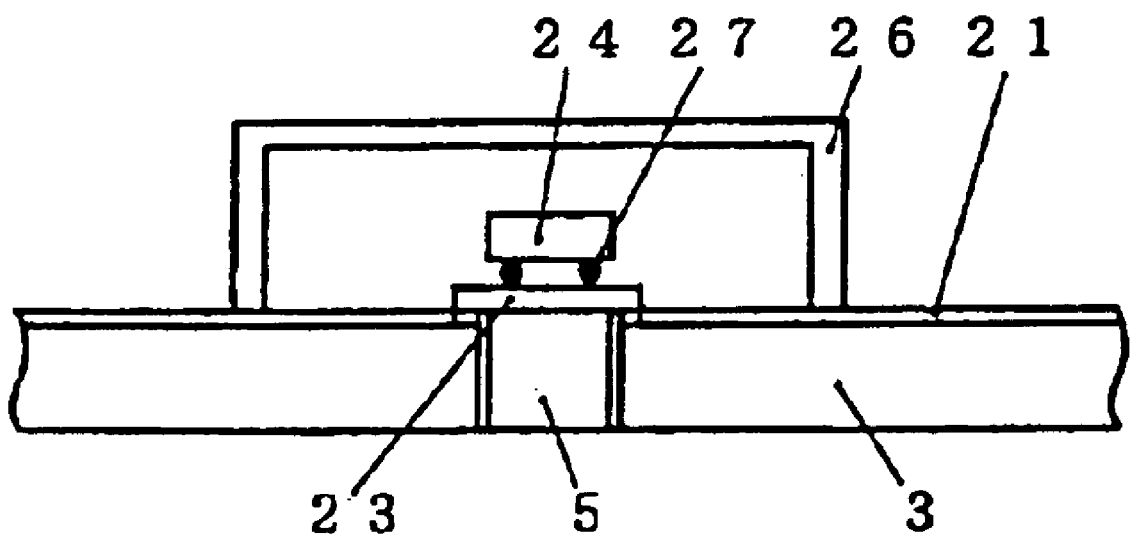
FIG. 7 is a schematic diagram of a section after flip chip mounting of a bare chip to a heat dissipating structure of a printed circuit board according to the present invention.

In a case where the bare chip 24 is mounted to the heat dissipating chip plate 23 by flip chip bonding (FIG. 7), bumps 27 formed on the bare chip 24 are connected to the heat dissipating chip plate 23 obtained by forming a circuit pattern on a insulating board. Though omitted in the drawing, a resin might cover between the bare chip 24 and the heat dissipating chip plate 23. With such coverage with a resin, heat of the bare chip 24 can be transferred through the heat dissipating chip plate and the metal plate 5 both with a high thermal conductivity to be finally dissipated into the air.

Figure 8A:
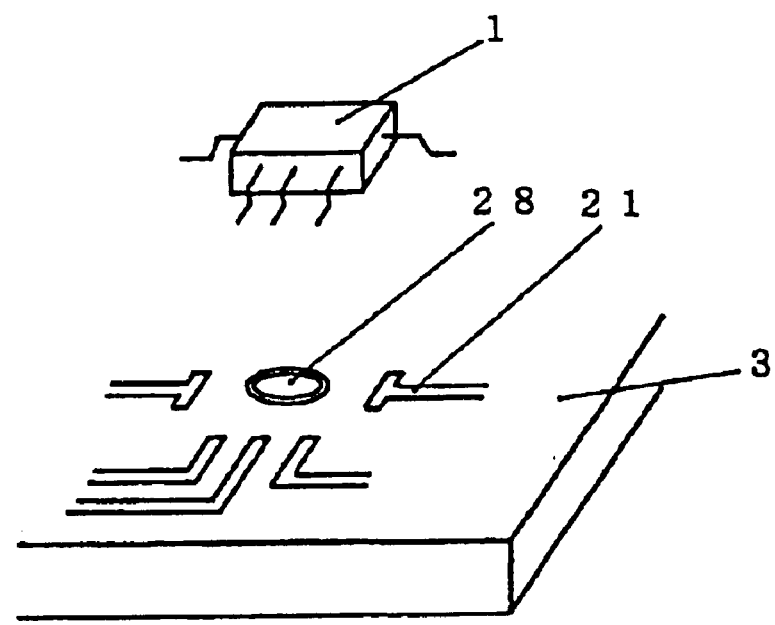
FIG. 8(a) is an explanatory view of a method of mounting an electronic part in a case where a rear surface of the electronic part is required to be insulated on a heat dissipating structure of a printed circuit board according to the present invention and FIG. 8(b) is a schematic diagram of a section after mounting.
Figure 8B:
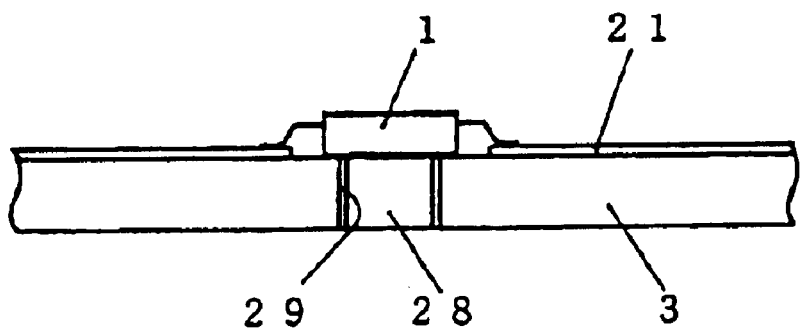
Figure 9:
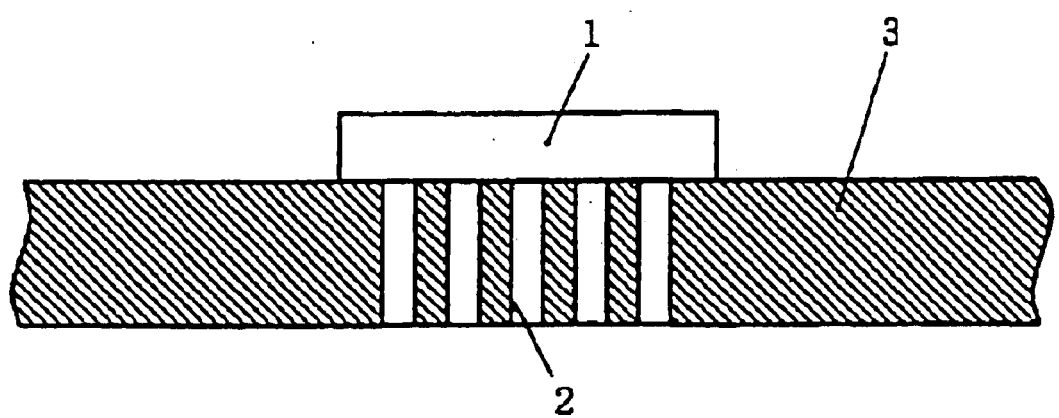
FIG. 9 is a schematic diagram of a section of a heat dissipating structure of a printed circuit board in which a conventional through hole is formed.
Figure 10:
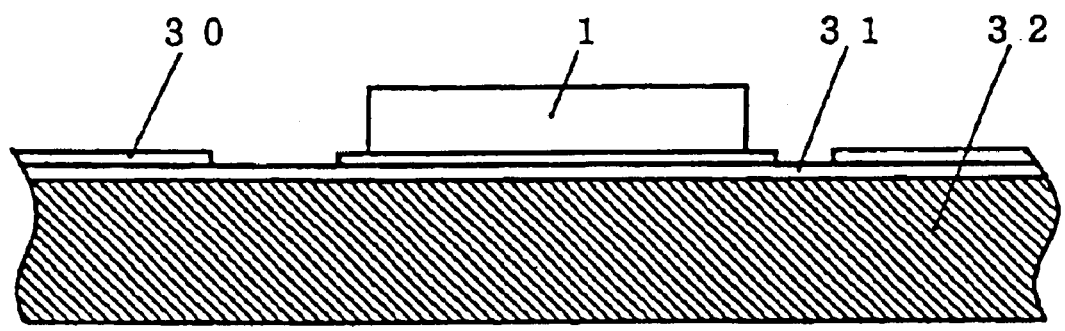
FIG. 10 is a schematic diagram of a section of a heat dissipating structure of a printed circuit board having a conventional metal core board.

FIG. 8(a) is an explanatory view of a mounting method in a case where a rear surface of an electronic part is insulated as an example of another mounting mode of an electronic part and FIG. 8(b) is a sectional view after mounting. Numeral 28 denotes a non-metal heat dissipating plate and 29 a printed circuit board processing hole (a through hole without a conductor layer on the inner wall thereof). The rear surface of the electronic part 1 having plural leads in a resin mold package and the non-metal heat dissipating plate 28 and the printed circuit board processing hole 29 are connected to one another with a non-conductive resin with a high thermal conductivity (a silicone resin with a high thermal conductivity or the like) and leads of the electronic part 1 and a conductor circuit layer 21 are bonded to each other with a metal solder or the like, thereby completing mounting of the electronic part 1. A material for the non-metal heat dissipating plate 28 can be a good thermal conductor other than a metal, for example ceramics for an electronic industry use.

While description has been given of the examples above, a heat dissipating structure according to the present invention might be of construction in which plural through holes and plural heat dissipating members are provided to one heat generating part. As to applications, a through hole, a heat dissipating member and an adhesive are made of an insulating material, which can be used exclusively for heat dissipation; and a heat dissipating member and an adhesive are made of a material with a good electrical conductivity and further a plated layer is formed on the inner wall surface of a through hole, which can be used for electrical connection. A printed circuit board can be used in various modes including a board with a circuit pattern on one surface, a board with circuit patterns on both surfaces, a board with circuit patterns in multiple layers. On the other hand, a fabrication method is also possible in which plural heat dissipating structures according to the present invention are formed on a single board, the board are cut into pieces each with a dissipating structure, which are individually incorporated into respective device housings. A structure according to the present invention can be sufficiently held with respect to a reliability without causing cracking and the like in the structure even in a general thermal shock test.

The present invention is a heat dissipating structure of a printed circuit board on which a circuit pattern is provided so that a heat generating part can be mounted, and which has a through hole formed at a site where the heat generating part is mounted from a surface on which the heat generating part is mounted to the opposite surface, wherein a heat dissipating member made of a material with a thermal conductivity higher than a board of the printed circuit board, and having a shape worked so that the heat dissipating member can be inserted into the through hole is mounted in the through hole with an adhesive interposed therebetween; therefore, heat generated from the heat generating part is efficiently dissipated from the GND surface of the printed circuit board or the heat dissipating fins connected to the printed circuit board by way of a heat dissipating member such as a metal plate with a high thermal conductivity. Since a heat dissipating member is shaped in advance of the use, no problem occurs about a flatness or bubbles therein. For this reason, a thermal resistance of a board section can be suppressed to an extremely low value.

A heat transfer plate made of a material with a thermal conductivity higher than the printed circuit board is adhered onto the heat dissipating member of the printed circuit board and heat generated by a heat generating part mounted on the heat transfer plate is transferred to the heat dissipating member by way of the heat transfer plate; therefore, heat from a heat generating part such as a bare chip can be efficiently dissipated by combination of a heat transfer plate and a heat dissipating member both with a high thermal conductivity, thereby enabling a rise in temperature of the heat generating part to be suppressed.

A method of fabricating a heat dissipating structure includes the steps of: blocking one opening of a through hole formed in a printed circuit board with a heat resistant tape; inserting a heat dissipating member, made of a material with a thermal conductivity higher than a board of the printed circuit board, and having a shape worked so that the heat dissipating member can be inserted into the through hole, into the through hole from the other opening of the through hole; fixing the heat dissipating member by putting an adhesive into a clearance between the through hole and the heat dissipating member to cure the adhesive; and removing the heat resistant tape from the printed circuit board; therefore, a board with a good heat dissipativity can be fabricated in the same operational steps as in a fabrication process of a general printed circuit board. Since a heat dissipating member which has been worked in advance is used, no necessity arises for a layer for securing a flatness of a board, a facility for preventing bubbles from occurring and the like either. Hence, no facility cost is required and a material cost can also be suppressed to be low.

A method of fabricating a heat dissipating structure includes the steps of: working shapes of a through hole and a heat dissipating member so that the heat dissipating member made of a material with a thermal conductivity higher than a board of a printed circuit board is supported in the through hole to insert the heat dissipating member into the through hole for provisional fixation; and fixing the heat dissipating member by putting an adhesive into a clearance between the through hole and the heat dissipating member to cure the adhesive; therefore, no necessity arises for a heat resistant tape, and adhesion and removal thereof, thereby enabling the heat dissipating structure to be fabricated in a simpler process.

The step of fixing the heat dissipating member by putting an adhesive into a clearance between the through hole and the heat dissipating member to cure the adhesive is performed in a procedure in which the adhesive is not only put into a clearance between the through hole and the heat dissipating member, but also attached onto the heat dissipating member, a heat generating part is mounted onto the heat dissipating member, and thereafter the adhesive is cured, whereby the through hole and the heat dissipating member, and the heat dissipating member and the heat generating part are collectively fixed simultaneously; therefore, steps of curing individual adhesive portions can be decreased.

What is claimed is:

1. A heat dissipating structure of a printed circuit board on which a circuit pattern is provided so that a heat generating part can be mounted, and which has a through hole formed at a site where the heat generating part is mounted from a surface on which the heat generating part is mounted to an opposite surface, wherein a heat dissipating member made of a material with a thermal conductivity higher than a board of the printed circuit board, and having a shape worked so that the heat dissipating member can be inserted into the through hole is mounted in the through hole with an adhesive interposed therebetween.

2. The heat dissipating structure of the printed circuit board of claim 1, wherein a heat transfer plate made of a material with a thermal conductivity higher than the printed circuit board is adhered on the heat dissipating member of the printed circuit board and heat generated by a heat generating part mounted on the heat transfer plate is dissipated to the heat dissipating member by way of the heat transfer plate.

\* \* \* \* \*

UNITED STATES PATENT AND TRADEMARK OFFICE
CERTIFICATE OF CORRECTION

PATENT NO. : 6,922,339 B2
DATED : July 26, 2005
INVENTOR(S) : Nakamura et al.

It is certified that error appears in the above-identified patent and that said Letters Patent is hereby corrected as shown below:

Column 1,
Line 24, delete "though" and substitute -- through --.

Column 2,
Line 29, after "and" delete "a".

Column 5,
Line 57, prior to "chip" insert -- bare --.

Signed and Sealed this

Fourth Day of April, 2006

JON W. DUDAS
*Director of the United States Patent and Trademark Office*